(12) United States Patent  
Mayer

(10) Patent No.: US 8,748,954 B2  
(45) Date of Patent: Jun. 10, 2014

(54) MULTILINEAR IMAGE SENSOR WITH CHARGE INTEGRATION

(75) Inventor: Frederic Mayer, Voiron (FR)

(73) Assignee: E2V Semiconductors, Saint-Égrève (FR)

( * ) Notice: Subject to any disclaimer, the term of this patent is extended or adjusted under 35 U.S.C. 154(b) by 0 days.

(21) Appl. No.: 13/514,982

(22) PCT Filed: Dec. 2, 2010

(86) PCT No.: PCT/EP2010/068694  
§ 371 (c)(1),  
(2), (4) Date: Jun. 9, 2012

(87) PCT Pub. No.: WO2011/069880  
PCT Pub. Date: Jun. 16, 2011

(65) Prior Publication Data  
US 2012/0248516 A1 Oct. 4, 2012

(30) Foreign Application Priority Data  
Dec. 9, 2009 (FR) ..................................... 09 58796

(51) Int. Cl.  
*H01L 31/062* (2012.01)

(52) U.S. Cl.  
USPC ............. 257/292; 257/223; 257/225; 438/48; 250/208.1; 348/302

(58) Field of Classification Search  
USPC .......... 257/292, 223, 225; 438/48; 250/208.1; 348/302  
See application file for complete search history.

(56) References Cited

U.S. PATENT DOCUMENTS

| 6,046,069 | A | 4/2000 | Ishikawa et al. |
| 6,465,820 | B1 * | 10/2002 | Fox .............................. 257/223 |
| 6,787,749 | B1 * | 9/2004 | Zhou et al. ................. 250/208.1 |
| 2006/0035401 | A1 | 2/2006 | Kobayashi et al. |
| 2007/0064137 | A1 | 3/2007 | Kanbe |
| 2009/0284632 | A1 * | 11/2009 | Onuki et al. .................. 348/302 |
| 2011/0068382 | A1 * | 3/2011 | Lauxtermann ............... 257/292 |
| 2012/0193683 | A1 * | 8/2012 | Mayer .......................... 257/225 |
| 2012/0241595 | A1 * | 9/2012 | Fereyre et al. ............. 250/208.1 |
| 2013/0140609 | A1 * | 6/2013 | Mayer et al. .................. 257/225 |

OTHER PUBLICATIONS

International Search Report for PCT/EP2010/068694, mailed Jan. 19, 2011.

* cited by examiner

*Primary Examiner* — Fernando L Toledo  
*Assistant Examiner* — Mohammed Shamsuzzaman  
(74) *Attorney, Agent, or Firm* — Lowe Hauptman & Ham, LLP

(57) ABSTRACT

The invention relates to linear time-delay and integration sensors (or TDI sensors). According to the invention, adjacent pixels of the same rank comprise, alternately, at least one photodiode and one transfer gate adjacent to the photodiode, the photodiodes comprising a common reference region of a first conductivity type, in which an individual region of opposite conductivity type is formed, itself covered by a individual surface region of the first conductivity type, characterized in that the surface regions of two photodiodes located on either side of a transfer gate are electrically separated so as to be able to be brought to different potentials in order to create potential wells and potential barriers allowing accumulation and transfer of charges as desired.

12 Claims, 4 Drawing Sheets

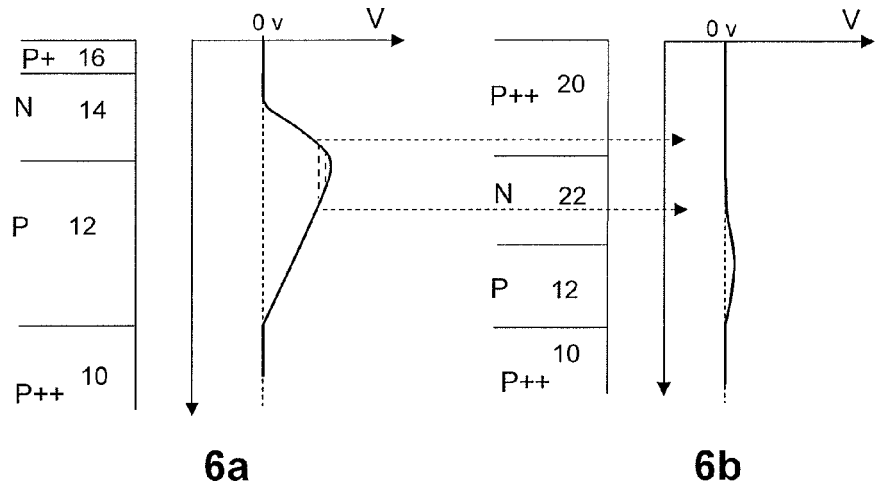
Fig. 6
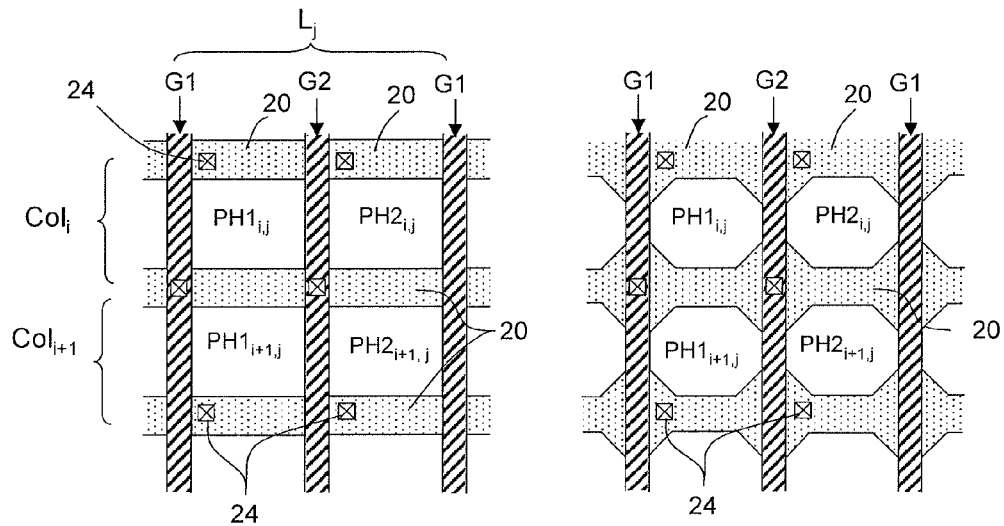
Fig. 7          Fig. 8
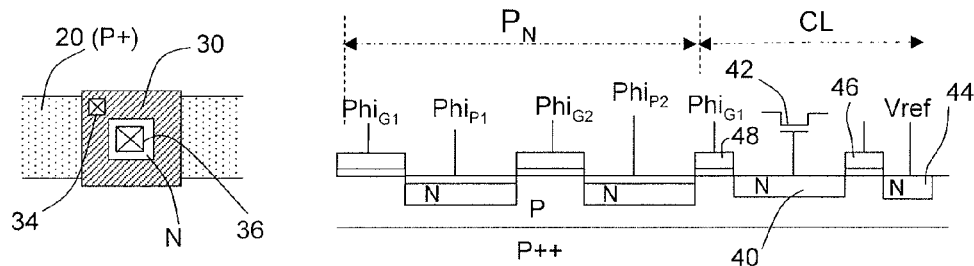
Fig. 9          Fig. 10

MULTILINEAR IMAGE SENSOR WITH CHARGE INTEGRATION

CROSS-REFERENCE TO RELATED APPLICATIONS

The present application is the U.S. National Stage of International Application No. PCT/EP2010/068694, filed on Dec. 2, 2010; which Application claims priority benefit of French Application No. 0958796, filed Dec. 9, 2009.

TECHNICAL FIELD

The invention relates to linear TDI (time-delay and integration) image sensors (or TDI sensors) in which an image of a row of points in an observed scene is reconstructed by adding successive images taken by several photosensitive rows by successively observing the same row of the scene as the scene scrolls before the sensor.

BACKGROUND ART

These sensors are used for example in scanners. They comprise a linear array of several parallel rows of photosensitive pixels. The sequencing of the control circuits of the various rows (control of the exposure time and then control of the readout of the photogenerated charges) is synchronized with respect to the relative scrolling between the scene and the sensor, so that all the rows of the sensor see in succession the same row of the observed scene. The signals generated by each row are then added point by point for each point of the row observed.

For a constant exposure time, the sensitivity of the sensor is improved in proportion to the number N of rows, or else, for a constant sensitivity, the exposure time may be divided by N. This number N may be, for example, 16 or 32 for industrial-control applications or for space-based Earth observation or even from 60 to 100 rows for medical applications (dentistry, mammography, etc.).

The signal-to-noise ratio is improved in proportion to the square root of the number N of rows of the sensor.

In addition, the sensitivity non-uniformity of the pixels in the same array, and the dark current non-uniformity of the pixels are reduced due to the averaging that results from adding the signals from the various rows.

In CCD (charge-coupled device) sensors, the pointwise addition of the signals is achieved simply by transferring to a row of pixels the charges generated and accumulated in the preceding row of pixels, synchronously with the relative movement between the scene and the sensor. The last row of pixels, having accumulated the charges generated by the observed image row N times, may be read out.

The usual CCD image sensor technology is relatively costly—it uses high supply voltages and consumes a substantial amount of energy. This technology is based on the use of adjacent, mutually-overlapping polysilicon gates.

Image sensor technology has since moved towards transistor-based active-pixel sensors, called from now on CMOS sensors for simplicity because they are generally fabricated in CMOS (complementary metal-oxide-semiconductor) technology. In these CMOS sensors there is no longer charge transfer from row to row towards a readout circuit or a register but instead transistor-based active pixels that gather photogenerated electrical charges and convert them directly into a voltage or a current. The various rows of the sensor therefore successively supply voltages or currents representative of the illumination received by the row. These structures do not allow noiseless addition of these currents or voltages and it is therefore difficult to produce a time-delay and integration charge sensor. The fabrication technology is however simple, consumes little power, and uses low voltages.

Attempts have however been made to fabricate TDI CMOS sensors.

In particular, switched capacitors in which successive received currents are integrated, thus accumulating in one and the same capacitor charges received from several pixels in a column, have been tried (U.S. Pat. No. 6,906,749, WO 01/26382).

It has also been proposed to convert the signals from a row of pixels into digital values and sum the digital value corresponding to the pixel of rank j of the row in an accumulating register of rank j that accumulates the numerical values corresponding to the pixels of one and the same rank j of N successive rows (patent FR 2 906 080).

In patent FR 2 906 081 it was proposed to apply, to the photodiode of a pixel in one row, the output voltage of a pixel in a preceding row so as to copy thereto the charges of the preceding pixel before isolating the photodiode and integrating new charges resulting from the light. Hence, at the end of an integration time the photodiode comprises the sum of the charges corresponding to the preceding row and the new integrated charges. This operation however induces transfer noise that reduces the signal-to-noise ratio.

Finally, solutions using charge accumulation in the pixel have been proposed, for example in the patent application US 2008/0217661. They use a more complicated technology than is strictly necessary for fabricating image sensors in CMOS technology or they induce losses during charge transfer.

Attempts to fabricate a linear TDI sensor using a technology simpler than the customary CCD technology have therefore not been satisfactory.

The object of the invention is to provide a more advantageous solution for fabricating sensors, operating according to the principle of charge-transfer structures but using a technology compatible with CMOS-technology circuits, and notably a technology that uses only a single polycrystalline silicon gate level and not a double, overlapping gate level as is the case in conventional CCD technologies.

SUMMARY OF INVENTION

According to the invention, a charge-transfer image sensor operating in time-delay and integration mode is provided, the sensor comprising N adjacent rows of P pixels with a view to using several rows of pixels in succession to observe one and the same image row by summing the electric charges generated by an image point in the pixels of the same rank of the various rows, the adjacent pixels of the same rank each comprising, alternately, at least one photodiode and one transfer gate adjacent to the photodiode, the photodiodes comprising a common reference region of a first conductivity type (in practice p-type), in which an individual region of opposite conductivity type (n-type) is formed, itself covered by an individual surface region of the first conductivity type (p-type), characterized in that the surface regions of two photodiodes located on either side of a transfer gate are electrically isolated from each other and electrically isolated from the common reference region, and in that the sensor comprises means of bringing these regions to potentials that are different from each other and are cyclically variable.

The electrical isolation referred to here is not a complete isolation by an infinite resistance: it is possible to use a region that is sufficiently resistive that the surface regions of adjacent photodiodes may be brought to different potentials that serve to transfer charge without the common reference region imposing its general potential level on these surface regions.

In practice, this electrical isolation mainly results from:

isolation in the direction of the columns: the lightly doped semiconductor regions located beneath the gates and adjacent to the surface regions of the first conductivity type are depleted of their carriers because of the potentials applied to the gates. These regions are therefore highly resistive and electrically isolate (even if there are small leakage currents) the surface regions from the non-depleted parts of the common reference regions (that are at a general, common potential). In so doing, they also isolate from one another the surface regions of adjacent photodiodes; and isolation between columns: if there are heavily doped regions of the first conductivity type ($p^+$- or $p^{++}$-type) between the columns, regions of the second conductivity type (n-type) are placed between these heavily doped regions and the common (p-type) reference layer so that the surface regions of the photodiodes are not connected to this reference layer via these heavily doped regions.

In the prior art, the surface regions of the photodiodes are electrically connected, by heavily doped ($p^+$-type) regions, to the common (p-type) reference region and their potential cannot be different from that of the reference region. It is therefore not possible to bring the surface regions to potentials different from one another.

By controlling the level of the potential barriers created beneath the transfer gates separating the various photodiodes, and by controlling, at the same time, the potential of the surface regions of the photodiodes, it is possible, cyclically, by means of a sequencing circuit to:

create a potential well beneath a first photodiode so as to accumulate charges therein;

at the same time, raise the bottom of the potential well of a second photodiode adjacent to the first so that the charges generated by the second photodiode flow into the first;

next, empty all the charges from the first photodiode into the second; and then, restart a cycle in which the second photodiode, having already received charges, acts as a first photodiode with respect to another photodiode belonging to another row of pixels.

The organization of the rows of pixels is preferably the following in which all the rows of pixels are controlled by identical signals: a pixel in a row of rank intermediate between the first row and the last row comprises, in succession, in the direction perpendicular to the direction of the rows of pixels, a first transfer gate allowing a variable-height potential barrier to be established, a first photodiode adjacent to the first gate, a second transfer gate, allowing a variable-height potential barrier to be established, and a second photodiode adjacent to the second gate and adjacent to the first gate of a pixel in the next row. Sequencing means are provided for applying different variable potentials to the surface regions of the first and second photodiodes during a charge integration and transfer cycle, and for applying different variable potentials to the transfer gates during the cycle.

Preferably, the sequencing means are designed to apply, to the photodiodes and to the gates of all the rows, potentials that vary periodically in four successive phases:

a first integration phase in which the charges generated by the light in the first photodiode of a pixel are accumulated by the first photodiode whilst the charges generated by the light in the second photodiode flow from the second photodiode into the first by passing beneath the second gate and accumulating in the first photodiode;

a first transfer phase in which the charges accumulated in the first photodiode are transferred to the second photodiode;

a second integration phase in which the charges generated by the light in the second photodiode are accumulated by the second photodiode whilst charges generated by the light in the first photodiode of the pixel in the next row flow into the second photodiode by passing beneath the first transfer gate of the pixel in the next row and accumulate in the second photodiode; and a second transfer phase in which the charges accumulated in the second photodiode are transferred to the first photodiode of the pixel in the next row by passing beneath the first transfer gate of the pixel in the next row.

In one particular embodiment, the potentials applied to the surface region of the second photodiode during the first transfer phase and during the second integration phase, respectively, are chosen so as to create a deeper potential well beneath the second photodiode during the first transfer phase than during the second integration phase. And, the same is true for the first photodiode, during the second transfer phase and the first integration phase respectively. In this case, the choice is made to preferably lower the potential barrier beneath the second transfer gate during the first transfer phase more than during the first integration phase. Likewise, the choice is made to lower the potential barrier beneath the first transfer gate during the second transfer phase more than during the second integration phase.

The various pixels in one and the same row are separated by isolating regions that are preferably formed from the superposition of:

an isolating region of the first conductivity type, adjacent to the photodiode surface regions doped so as to have the first conductivity type, but more heavily doped than these surface regions; and an isolating region of the second conductivity type that completely isolates the isolating region of the first conductivity type from the common reference region of the first conductivity type.

The isolating regions of the first conductivity type touch the surface regions of the photodiodes and may serve to deliver the desired control potentials thereto.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF DRAWINGS

The present invention is illustrated by way of example, and not by limitation, in the figures of the accompanying drawings, wherein elements having the same reference numeral designations represent like elements throughout and wherein:

FIG. 6 shows the internal potentials in differently doped $p^+/n/p/p^{++}$ structures;

FIG. 7 shows a top view depicting the lateral separation between pixels in one and the same row;

FIG. 8 shows another top view in which the bevelled shape of the photodiodes makes the transfer of electrical charges to the adjacent photodiodes easier;

FIG. 9 shows a view of a an anti-blooming structure that may be associated with the isolation regions between pixels of one and the same row; and FIG. 10 shows a readout circuit after the $N^{th}$ row of pixels.

DESCRIPTION OF EMBODIMENTS

Figure 1:
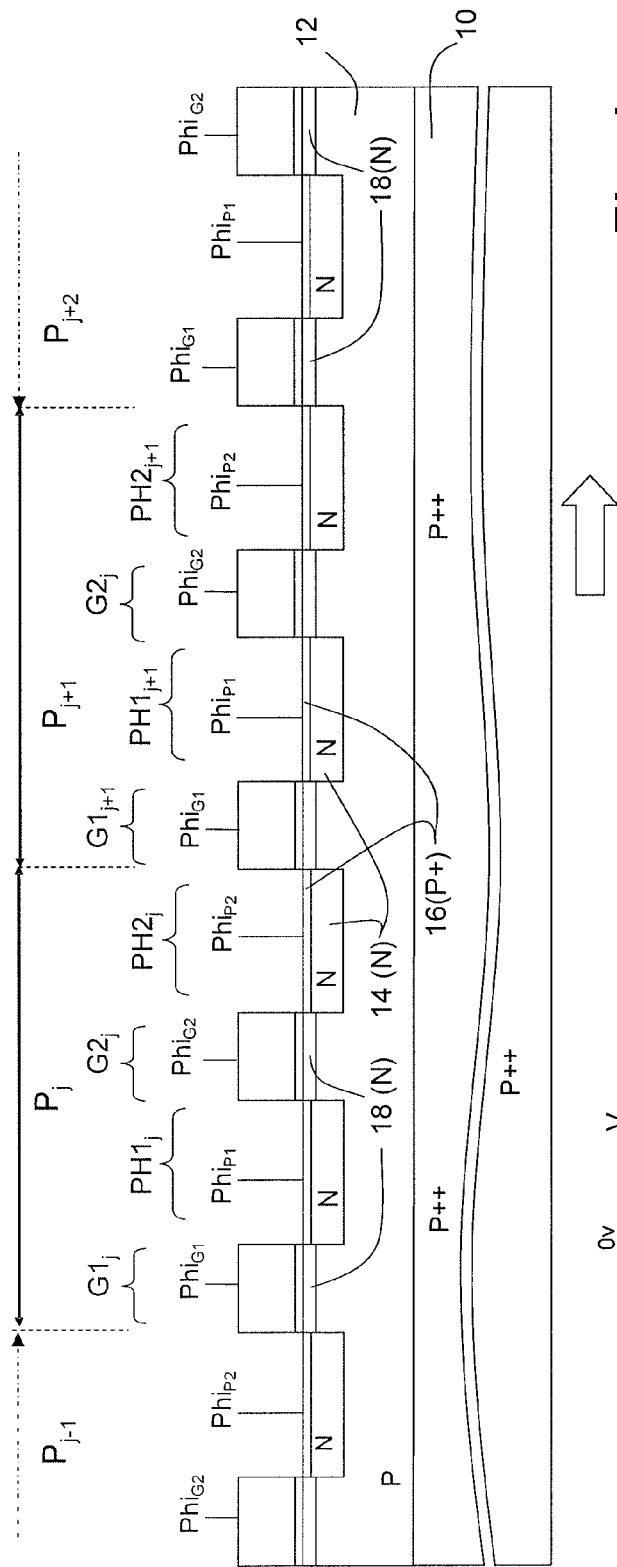
FIG. 1 shows a cross-sectional view, perpendicular to the direction of the rows, of the structure of a multilinear photosensitive sensor according to the invention.

The cross-sectional view of FIG. 1 shows several successive pixels, of one and the same column, in a image sensor array comprising N adjacent rows each of P pixels, the array being intended to operate in TDI mode. Each row of rank j (j=1 to N) successively reads one and the same image row during a synchronized scan of the image relative to the array in the direction perpendicular to the direction of the rows. The charges of the pixels of the same rank i (i=1 to P) of the various rows correspond to the observation of one and the same image point and these charges are accumulated in order to obtain a larger signal (for a given exposure time of each row of pixels) than if only one row saw the image, improving the signal-to-noise ratio.

Essentially, the pixels $P_j$ and $P_{j+1}$ of rank j and j+1 respectively one column have been shown.

The pixels are formed in a semiconductor substrate 10 the top part of which is an lightly doped epitaxial semiconductor layer 12. In this example, the substrate is of heavily doped $p^{++}$-type and the epitaxial layer is of p-type. If the epitaxial layer were of n-type, it would be necessary to invert all the conductivity types that will now be defined, and the signs of the potentials applied to the photodiodes and to the gates. The substrate in principle has the same conductivity type as the epitaxial layer, but it could also be of the opposite conductivity type.

The columns comprise, alternately, photodiodes and charge-transfer gates. It is possible to consider that a group consisting of a photodiode and an adjacent gate forms either a half-pixel, the pixels being controlled so as to be all in phase, or a whole pixel, the adjacent pixels then being controlled so as to be in phase opposition. In what follows, a photodiode and an adjacent gate will be considered to form a half-pixel, all the pixels of the sensor receiving the same control signals.

Each pixel therefore comprises two photodiodes PH1, PH2 and two charge-transfer control gates G1, G2 adjacent to the photodiodes. The photodiodes and gates are assigned the indices j and j+1 in FIG. 1, for the pixels $P_j$ and $P_{j+1}$, respectively. The gates are polycrystalline silicon gates, isolated from the epitaxial layer 12 by a thin isolating layer (silicon oxide or nitride). The photodiodes are made of a stack comprising: the p-type epitaxial layer 12 (the common reference layer for all the photodiodes of all the pixels), an n-type individual region 14, diffused into the epitaxial layer between two transfer gates, and a $p^+$-type individual surface region 16, more heavily doped that the epitaxial layer, that covers the individual region 14. The electrons generated by the illumination will be able to accumulate in potential wells formed at the p-n junction between the n-type region and the p-type epitaxial layer.

More precisely, the pixel of rank j comprises, juxtaposed in the direction of the column, from left to right in FIG. 1:
 a first transfer gate $G1_j$;
 a first photodiode $PH1_j$;
 a second transfer gate $G2_j$; and
 a second photodiode $PH2_j$.

The second photodiode of the pixel $P_j$ is immediately followed by the first transfer gate of the next pixel $P_{j+1}$, likewise the first transfer gate of the pixel $P_j$ is immediately preceded by the second photodiode of the preceding pixel $P_{j-1}$.

The control signals for all the first and second transfer gates G1 and G2 are variable potential signals $\text{Phi}_{G1}$ and $\text{Phi}_{G2}$ applied to these gates. The control signals for the photodiodes PH1 and PH2 are variable potential signals $\text{Phi}_{P1}$ and $\text{Phi}_{P2}$ applied to the $p^+$-type surface region 16 of the corresponding photodiode. These signals are produced by a sequencing circuit (not shown). It will be seen further on how it is possible to supply these signals to the photodiodes.

When operating in TDI mode, the direction of charge transfer depends on the applied potentials. Here only the transfer from left to right is will be considered, but the structure of the sensor according to the invention allows the direction to be advantageously chosen at will. The movement of the image relative to the rows of the array must be synchronized and must correspond to the transfer direction chosen.

Figure 2:
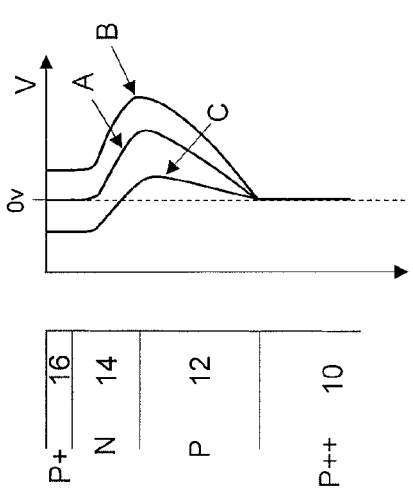
FIG. 2 shows the potential profile inside the semiconductor for a superposition of $p^+$-, n-, p- and $p^{++}$-type conductivities.

The application of a variable potential to a $p^+$-type surface of a photodiode creates a potential well of variable depth near the junction between the n-type region of this photodiode and the epitaxial layer. FIG. 2 explains this effect: this figure shows the internal potential profile in the $p^+/n/p/p^{++}$ semiconducting structure that forms the photodiode (in the absence of photogenerated charges). The reference potential, considered as equal to zero, is that of the $p^{++}$-type substrate. The x-axis, directed downwards in FIG. 2, shows increasing depth away from the $p^+$-type surface region towards the $p^{++}$-type substrate. The y-axis shows the maximum potential V at the depth considered. Three curves A, B, C are shown. Curve A shows the potential profile when the surface region is brought to a voltage of 0 volts: the profile has a positive potential peak (potential well for electrons) around the junction between the n-type region and the p-type epitaxial layer. When a positive potential is applied to the $p^+$-type surface region (curve B), the potential well deepens as the potential applied increases. When a negative potential is applied to the surface region (curve C), the depth of the potential well is reduced as the applied potential is lowered.

Moreover, under a transfer gate a potential barrier is created that increases in height as the potential applied to the gate is lowered. The potentials applied to the gates are chosen according to the level of the potential wells created in the photodiodes, according to whether it is desired to accumulate charges in a photodiode or to transfer them to one side or the other of the photodiode.

Finally, the surface regions 16 of the various photodiodes in one and the same column are electrically isolated from one another so that they may be brought to different potentials and thus transfer charge. This does not need to be perfect isolation in the sense that there may be leakage currents. The isolation consists notably in electrically separating the surface regions 16 from the p-type common reference layer so that this layer does not equalize the potential of the $p^+$-type surface regions, as was the case in the prior art. This electrical isolation or separation is a result of:

between two photodiodes of one and the same column, the isolation results from a depletion of the semiconductor regions located beneath the gates, these semiconductor regions are lightly doped and are highly resistive if they are depleted of carriers—they prevent the surface regions 16 from making direct contact with the epitaxial layer 12;

beneath a photodiode, the isolation of the region 16 is achieved via the n-type region 14; and finally, between photodiodes of one and the same row, it will be seen that no isolation is necessary because all the surface regions of one and the same row may be brought to the same potential; however, it is necessary to be careful not to directly connect these regions to the epitaxial layer when diffusing the highly doped regions that might be placed between the columns—more will be said on this point later on.

The semiconductor regions located beneath the gates G1 and G2 are part of the epitaxial layer and are either doped like the latter or slightly more doped if it is desired to adjust the threshold voltage for conduction beneath the gates, however, in any case, the doping is sufficiently weak so that the resistivity of these regions is very high when they are depleted. The maximum allowable doping depends on the leakage currents that are acceptable. The potential applied to the gates is sufficiently low so that the depletion occurs at a depth at least equal to the depth of the regions 16.

The invention uses these parameters to control the accumulation of charges in the photodiodes and to subsequently transfer these charges and sum the charges of the various photodiodes of one and the same column.

The operation is overall the following, for a complete cycle of transfer from one pixel in a row to the pixel of the same rank of the next row:

during a first integration time, the potential applied to the $p^+$-type region of the first photodiodes PH1 is a potential high enough to create a potential well in which the charges generated in these photodiodes by the light accumulate. This high potential may be equal to zero (cf. curve A in FIG. 2). These charges are added to the charges already present in this photodiode and which result from a preceding charge transfer cycle. At the same moment, the potential applied to the second photodiodes PH2 is a low potential preventing charge accumulation in the second photodiodes. In addition, the potential of the gate $G2_j$ that separates the photodiode $PH2_j$ from the first photodiode $PH1_j$ of the same pixel is high enough to allow charges from this second diode to flow to the first photodiode. The potential of the gate $G1_{j+1}$ of the next pixel is on the contrary low enough to create a potential barrier preventing charges from passing from the second photodiode PH2 to the next pixel $P_{j+1}$. The result is that the photodiode accumulates all the charge generated by the light in the two photodiodes of the pixel, in addition to the charges already present at the start of the cycle;

at the end of the first integration time, the potentials of the gates and of the photodiodes are modified so as to ensure that all the charges are transferred from the first photodiode of the pixel to the second photodiode of the pixel;

during a second integration time, the roles of the first and second photodiodes are reversed, the potential of the second photodiodes PH2 being a potential high enough (here again 0 volts may be sufficient) to create a potential well in which the charges generated in these photodiodes by the light accumulate. At the same moment, the potential applied to the first photodiodes PH1 is a low potential preventing the formation of a potential well. In addition, the potential of the gate $G1_{j+1}$ that separates the photodiode $PH2_j$ from the first photodiode $PH1_{j+1}$ of the next pixel is high enough to allow charges to flow from this next first photodiode to the second photodiode $PH2_j$ and the potential of the gate $G2_j$ of the pixel is low enough to create a potential barrier preventing charges from passing from the second photodiode $PH2_j$ to the first $PH1_j$ and preventing charges from passing from the first photodiode $PH1_j$ to the second. The result is that the second photodiode of the pixel $P_j$ accumulates its own charges and those of the first photodiode of the next pixel $P_{j+1}$; and at the end of the second integration time, the potentials of the gates and of the photodiodes are modified so as to ensure that all the charges are transferred from the second photodiode $PH2_j$ to the first photodiode $PH1_{j+1}$ of the next pixel. This photodiode $PH1_{j+1}$ therefore receives at this moment charges that are the sum of three components: the charges previously accumulated by the photodiode $PH1_j$ before the first integration time, the charges accumulated by the diodes $PH1_j$ and $PH2_j$ during the first integration time, and the charges accumulated by the photodiodes $PH2_j$ and $PH1_{j+1}$ during the second integration time.

A new cycle of two charge integrations and two charge transfers may then recommence. The cycles end, after the integration in a last pixel of rank N, when an image row stops being observed by the array. The charges accumulated in each column by N readings of one and the same image row are available in the second photodiode at the end of the second integration time of the $N^{th}$ cycle and they may be read out.

Figure 3:
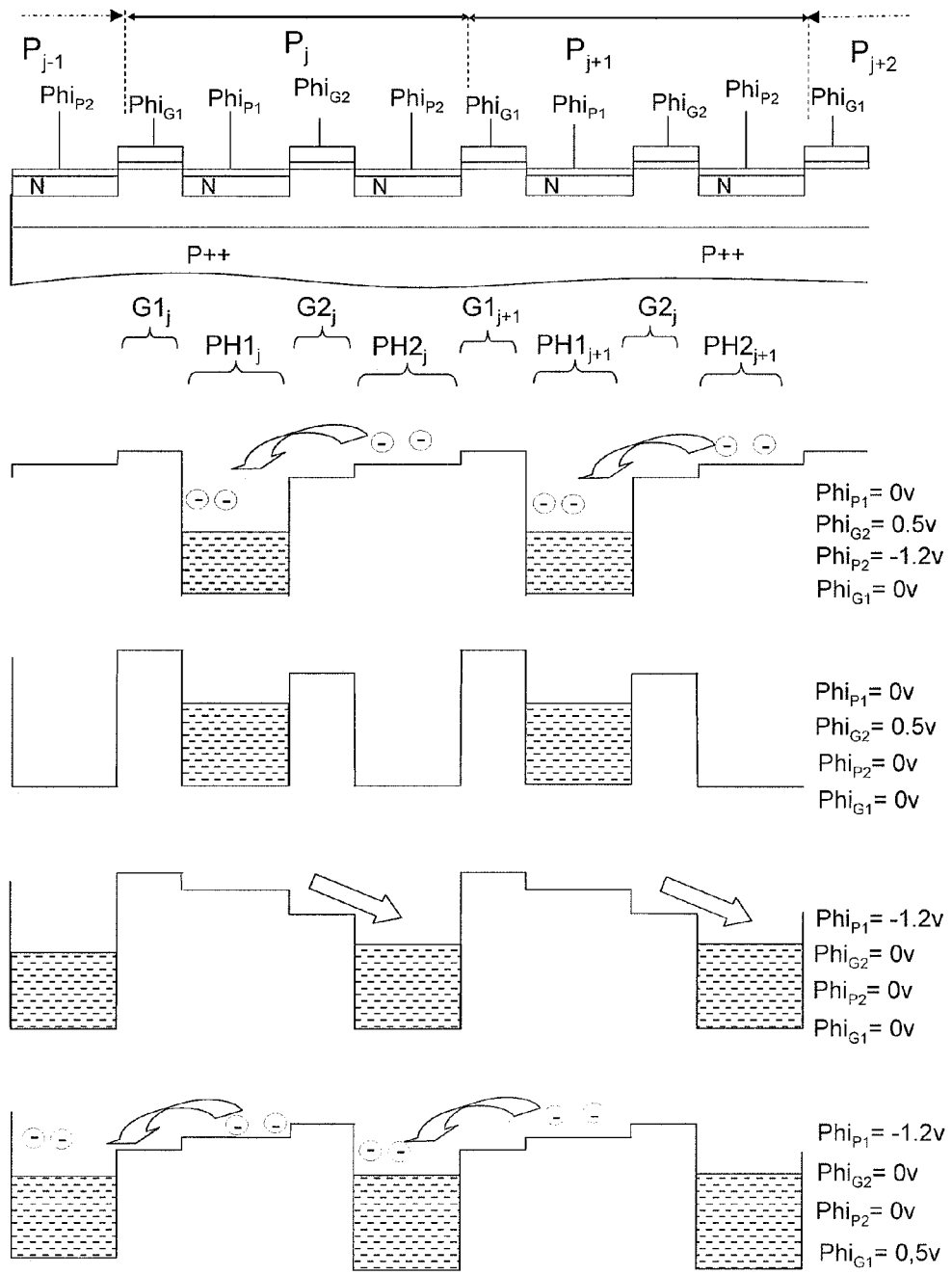
FIG. 3 shows a diagram of the potentials created in the semiconductor, with the potential wells and potential barriers, in the various integration and transfer phases.

FIG. 3 shows schematically, beneath the pixel structure according to the invention, diagrams of the potentials in the epitaxial layer 12 as a function of the potentials applied to the gates and to the surface regions of the photodiodes. The most negative potentials are at the top and the more positive potentials are at the bottom, so as to show the potential wells and the barriers that flank them.

During the first integration phase (upper diagram), the potential $Phi_{P1}$ applied to the first photodiodes is a zero potential creating a deep potential well. The potential $Phi_{P2}$ applied to the second photodiodes is a negative potential (here −1.2 volts) creating in the semiconductor a potential that is clearly lower than the bottom of the potential well present beneath the first photodiodes. The two transfer gates $G1_j$ and $G2_j$ are brought to low potentials $Phi_{G1}$ and $Phi_{G2}$, creating potential barriers that close off the potential wells present beneath the first photodiodes. The heights of these barriers are different. Beneath the gate $G1_j$, the barrier is slightly higher than the potential created by $Phi_{P2}$ beneath the second photodiodes (retaining the charges created by the latter). Beneath the gate $G2_j$, the barrier is on the contrary lower than this potential—hence the electrons generated by the light in the second photodiodes cannot accumulate or be transferred to the next pixel and therefore are only able to be transferred to the first photodiodes. In this example, to obtain this result, a potential of 0 volts was applied to the first transfer gates G1 and a positive potential of 0.5 volts is applied to the second gates G2, but it will be understood that the potentials applied depend on the depths and doping levels of the various semiconductor or isolating layers.

At the end of this first integration time, the potentials are modified in the following way in order to transfer charges in two steps. In a first transfer step, the $p^+$-type surface region of the second photodiodes is brought to a zero potential ($Phi_{P2}=0$), lowering the potential in the semiconductor (second diagram from the top in FIG. 3) and creating an (empty) potential well in this location. In a second step (third diagram in FIG. 3), the level of the bottom of the potential wells still present beneath the first photodiodes is raised up to a potential intermediate between the potential beneath the first gates G1 and the potential beneath the second gates G2. In this example, the potential $Phi_{P2}$ applied to the second photodiodes is first brought to 0 volts (first step), then the potential $Phi_{P1}$ applied to the first photodiodes is brought to −1.2 volts (second step). The charges previously stored in the wells beneath the first photodiodes can be transferred only to the potential well beneath the second photodiodes. There is complete transfer of the charges accumulated in the first photodiode to the second photodiode.

This first integration time and the first charge transfer form half of the cycle of transfer from one row to the next. The second half of the cycle is identical to the first half, but the roles of the first and second photodiodes and the first and second gates are reversed. First there is a second integration time (fourth diagram in FIG. 3) and a second charge transfer. During the second integration time, the charges generated by the light in the second photodiode of the pixel $PH2_j$ accumulate in this photodiode, whereas the charges generated by the light in the first photodiode $PH1_{j+1}$ of the next pixel $P_{j+1}$ transfer to the second photodiode $PH2_j$ of the pixel $P_j$.

At the end of the second integration time, a second charge transfer (not shown) identical to the first, but reversing the roles of the two photodiodes and of the two transfer gates, is carried out. The second charge transfer transfers all the charges that were stored in the second photodiode of the current pixel $P_j$ to the first photodiode of the next pixel $P_{j+1}$.

This second transfer marks the end of a cycle. The first photodiode of the pixel $P_{j+1}$ now contains the sum of the charges accumulated during the readout of an image point by all the pixels $P_1$ to $P_j$, the charges resulting from the readout of the same image point by the pixel $P_{j+1}$ will be added in the following cycle.

It should be noted that the direction of the applied potentials allows progressive transfer of charge from left to right, but it would also be possible to transfer charge from right to left by systematically reversing the potentials applied to the gates G1 and G2 both during the integration phases and during the transfer phases.

In the exemplary potential well and potential barrier levels shown in FIG. 3, the potential beneath the second photodiode at the moment of the first charge transfer, between the two integrations, is considered to be identical to the level of the bottom of the potential well during the integrations. However, as a variant, the potential well may be made slightly deeper during the transfers (so as to accelerate this transfer) by applying a positive potential, instead of a zero potential, to the surface region of the photodiode that will receive the transferred charges.

In addition, in this case, it may also be possible for the potential barrier, beneath the gate that controls this transfer, to be temporarily lowered during the second step of charge transfer (whereas in the case of FIG. 3 the potential applied to the gate G2 remained the same until the start of the second integration).

Figure 4:
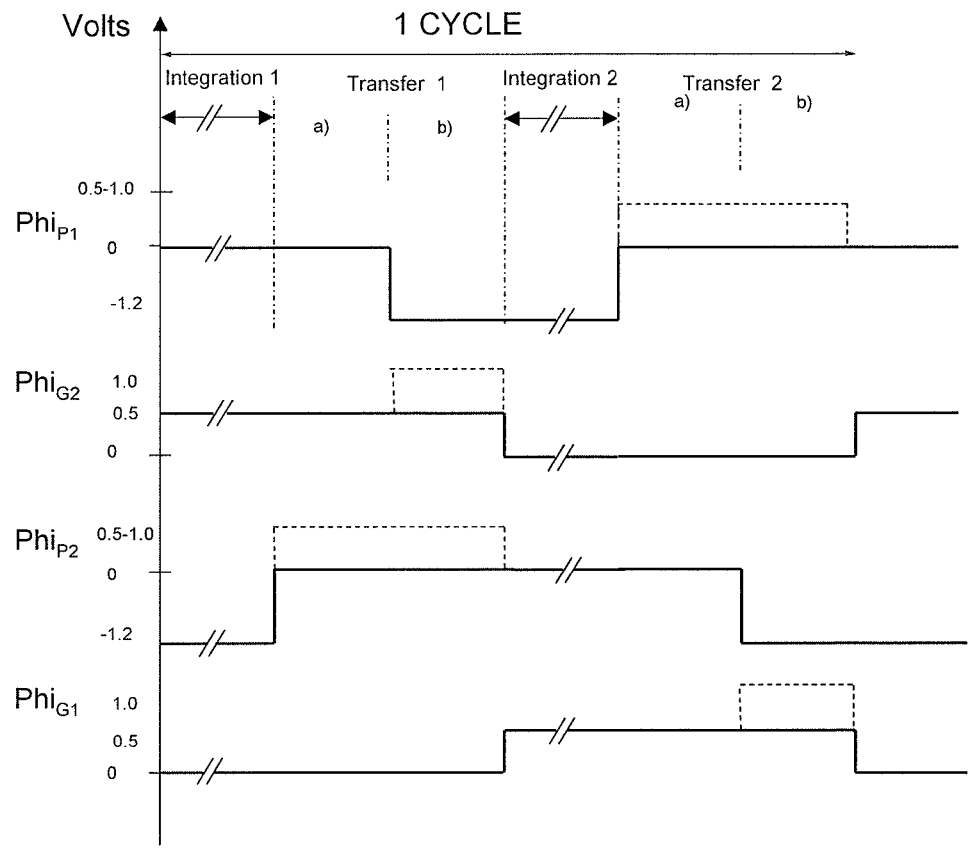
FIG. 4 shows a timing diagram for the control signals of the sensor.

FIG. 4 shows one possible timing diagram for the control potentials applied to the photodiodes during a cycle of two integration times and two transfers. Shown in the figure is the first integration time ($Phi_{P1}=0$, $Phi_{P2}$ negative, $Phi_{G1}=0$, $Phi_{G2}$ positive); the first step of the first transfer ($Phi_{P2}$ passes to zero or even to a positive value); the second step of the first transfer ($Phi_{P1}$ becomes negative and $Phi_{G2}$ may remain the same or it may be increased, but preferably only if $Phi_{P2}$ becomes positive); then the second integration time ($Phi_{P1}$ and $Phi_{P2}$ switched over relative to the first integration time, and also $Phi_{G1}$ and $Phi_{G2}$ switched over); and the two steps of the second transfer time ($Phi_{P1}$ and $Phi_{P2}$ switched over relative to the first transfer time, and also of $Phi_{G1}$ and $Phi_{G2}$ switched over).

Figure 5:
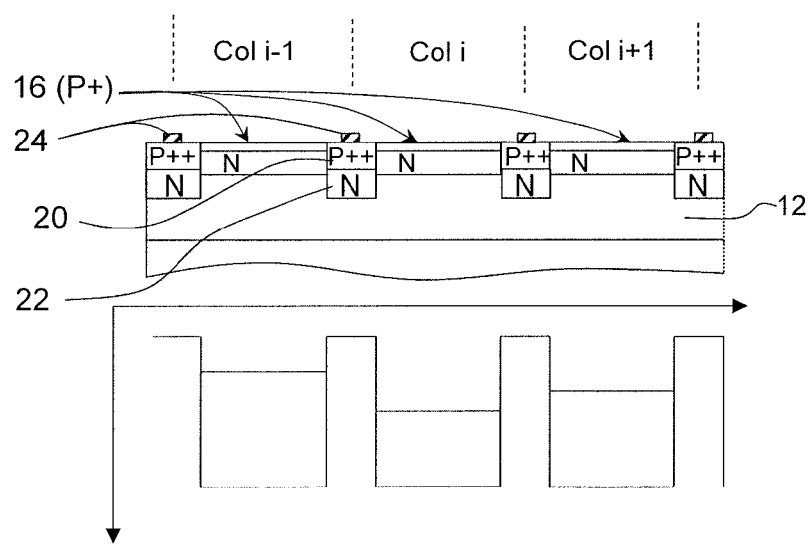
FIG. 5 shows a cross section of the sensor parallel to the rows of pixels and the corresponding internal potentials.

FIG. 5 shows a cross section of the structure in a direction parallel to the rows of the array, in which three juxtaposed columns of ranks i−1, i and i+1 may be seen. The photodiodes of one and the same row are separated by isolating structures that comprise $p^{++}$-type diffusions 20 each covering an n-type region 22 that may be deeper than the n-type regions of the photodiodes but that remains adjacent to the n-type regions of the photodiodes. The term "$p^{++}$-type" assigned to the regions 20 is understood to mean that these regions 20 are more highly doped than the $p^+$-type surface regions 16. These isolating structures play two roles:
    on the one hand they separate the potential wells of adjacent photodiodes of different columns from one another by forming potential barriers preventing the charges of a pixel of one column mixing with those of an adjacent pixel of another column; and
    on the other hand they are in contact with the $p^+$-type surface regions of the photodiodes and allow a desired potential to be applied to these surface regions.

The regions 20 are entirely isolated from the epitaxial layer by the regions 22. Indeed, if they were in contact with the p-type epitaxial layer it would not be possible to apply different potentials to the $p^+$-type surface regions of the various photodiodes without creating completely unacceptable leakage currents.

Consequently, the regions 20 are directly adjacent to the $p^+$-type surface regions of the photodiodes, but, moreover, they are entirely surrounded, laterally by the n-type regions of the photodiodes and are enclosed lower down by the n-type regions 22; they are not adjacent to the non-depleted parts of the p-type epitaxial layer 12 (they are however adjacent to the epitaxial layer 12 beneath the gates, but here this layer is depleted and therefore highly resistive).

It should be noted that there is no need to electrically isolate the surface regions 16 of photodiodes adjacent in the direction of the rows because a common potential $Phi_{P1}$ (for the first photodiodes PH1) or $Phi_{P2}$ (for the second photodiodes) is applied to all the adjacent photodiodes of one and the same row.

An electrical contact 24 is formed on the $p^{++}$-type regions 20 (not necessarily on all of them, as the $p^{++}$-type regions of one and the same row are in electrical contact via the $p^+$-type regions 16 of this row). The contacts 24 are not necessarily in the plane of the cross section in FIG. 5, but for convenience they have been shown in this figure.

Potentials $Phi_{P1}$ and $Phi_{P2}$ are applied via the contacts 24 so that it is not necessary to provide specific contacts on the $p^+$-type surface regions 16 themselves, which are in principle shallower and therefore not well suited to receiving a metal contact.

Although the $p^+$-type surface regions of the photodiodes and the $p^{++}$-type isolating regions 20 are brought to the same potential, the potential profile inside the semiconductor is not the same in the photodiodes as in the isolating structures between photodiodes of one and the same row. It is necessary to create a potential barrier that prevents stored charges from passing between the photodiodes of neighbouring columns. To do this, it is necessary to create doping profiles in the semiconductor that are different to those in the isolating structures 20, 22 and in the photodiodes. If the ratio of the impurity concentration in the region 20 to the impurity concentration in the region 22 is greatly increased (in comparison with the ratio of the concentrations in the regions 16 and 14 of the photodiodes), the depth of the potential well created around the junction between the region 22 and the epitaxial layer is considerably reduced. The relatively deep potential well created beneath the photodiode adjoins then a very shallow potential well created beneath the isolating regions. This means that, a potential barrier, such as that shown in the lower part of FIG. 5, separates the potential wells created beneath two adjacent photodiodes whilst the potential applied to the regions 20 and 16 is the same, since it is via the region 20 that a potential is applied to the region 16. In practice, the doping in the region 22 is the same as in the regions 14, but the doping in the region 20 is higher than in the region 16 (and preferably the depth of the region 20 is greater than the depth of the region 16).

FIG. 6 explains in greater detail the reason for this potential barrier obtained using different doping profiles.

FIG. 6, drawn like FIG. 2, shows the potential profile inside the semiconductor, in the absence of photogenerated charges, for two different doping profiles, namely the profile beneath the photodiode (FIG. 6A) and the profile beneath the isolating region 20 (FIG. 6B), and for one and the same potential (here a zero potential) applied to the p$^+$-type regions 16 and 20. The x-axis, showing the depth, is directed downwards and the y-axis, showing the potential, is directed towards the right. At a given depth, the potential in the photodiode in the absence of charges is always higher than the potential in the adjacent isolating region, so that the potential well may be filled with negative charges whilst remaining flanked by potential barriers that hold back the charges.

FIG. 7 shows a top view of two adjacent pixels in one and the same row $L_j$ or rank j, belonging to two neighbouring columns of rank i and i+1. The respective photodiodes are denoted by PH1$_{i,j}$ and PH2$_{i,j}$ for the first pixel and PH1$_{i+1,j}$ and PH2$_{i+1,j}$ for the second. The p$^+$-type isolating regions between pixels in one and the same row are denoted by the reference 20 and electrical contacts 24 are made on these regions so as to apply potentials Phi$_{P1}$ and Phi$_{P2}$ to the p$^+$-type regions of the photodiodes. The contacts may be connected to aluminium lines (not shown) that carry the potentials Phi$_{P1}$, to the first photodiodes, and Phi$_{P2}$, to the second photodiodes. The gates G1 and G2 that separate the first photodiodes from the second photodiodes extend along the entire length of the rows of pixels. They are also provided with contacts distributed in places which contacts can be connected to aluminium conductors (not shown) that carry the required potentials Phi$_{G1}$ and Phi$_{G2}$ to these gates.

FIG. 8 shows an embodiment in which the geometrical shape of the surface of the photodiodes is modified in a way that makes the transfer of charge from one photodiode to another easier i.e. the corners of the photodiodes turned towards an adjacent photodiode are bevelled so as to limit the width of the transfer gates between two photodiodes. The isolating regions 20 are consequently flared.

FIG. 9 shows an improvement in which anti-blooming devices are provided, located in the isolating regions 20. One and the same anti-blooming structure may serve for two adjacent pixels separated by a region 20. The structure preferably comprises a central n$^+$-type region, forming a drain, covered with a drain contact enabling said region to be brought to a positive supply potential. This drain is entirely surrounded, laterally, by the p$^+$-type region 20. An insulated control gate covers a space running from the photodiode to the drain. Adjustment of the potential applied to this gate defines the blooming threshold from which charges generated in the photodiode will be transferred to the drain and removed. It is possible for the anti-blooming structure to be controlled row-by-row (or even in groups of rows) rather than controlling all the rows globally, hence it is possible to apply different potentials to the anti-blooming gates of the various rows or various groups of rows. This in particular allows the number of charge accumulation rows effectively used in an image capture operation to be limited to a number N' less than N. To do this, it is enough to increase the potential of the anti-blooming gates in the first rows that will not be used, so that the charges generated in the photodiodes of these rows are systematically transferred to the anti-blooming drain, instead of being accumulated in the photodiodes—only the other rows accumulate charges.

If the semiconductor substrate 10 were n$^{++}$-type with a p-type epitaxial layer, the anti-blooming means would be different: an n$^{++}$-type substrate would be used as vertical anti-blooming drain instead of a lateral n$^+$-type region and the anti-blooming threshold would be adjusted by applying an adjustable bias to the epitaxial layer.

FIG. 10 shows a possible configuration for a charge readout stage placed at the end of a column of pixels, the cross section being in the direction of the column and the last pixel P$_N$ of the column is shown followed by a readout stage CL. The readout stage preferably comprises an n-type floating diffusion 40 (analogous to the diffusion of a photodiode but not covered with a p$^+$-type surface region), a readout transistor 42 and a reset transistor consisting of a drain 44 (at a positive reference potential Vref) and an insulated gate 46 separating the floating diffusion 40 from the drain 44. After the last charge integration step in the row of rank N, the charges contained in the second photodiode of the pixel P$_N$ are transferred to the floating diffusion 40 via a final gate 48 that may be controlled by the potential Phi$_{G1}$ as though there were an N$^{th}$+1 pixel after the pixel P$_N$.

In the foregoing, the two photodiodes of a pixel were considered to be identical in terms of geometry, area and doping of the surface region, but this is not obligatory.

The sensor according to the invention may be frontlit or backlit.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. An image sensor operating in time-delay and integration mode, the sensor comprising N adjacent rows of P pixels with a view to using several rows of pixels in succession to observe one and same image row by summing electric charges generated by an image point in the pixels of same rank of the various rows, adjacent pixels of the same rank comprising, alternately, two photodiodes and two transfer gates adjacent to the photodiodes, the photodiodes comprising a common reference region of a first conductivity type, in which individual regions of opposite conductivity type are formed, and covered by individual surface regions of the first conductivity type, wherein the surface regions of two photodiodes located on either side of a transfer gate are electrically isolated from each other and electrically isolated from the common reference region, wherein the sensor comprises a sequencing circuit bringing the regions to potentials that are different from each other and are cyclically variable, wherein the sequencing circuit is configured for applying potentials cyclically to the gates and to the photodiodes so as to:
create a potential well beneath a first photodiode so as to accumulate charges therein;
at the same time, raise the bottom of the potential well of a second photodiode adjacent to the first so that the charges generated by the second photodiode flow into the first;
next, empty all the charges from the first photodiode into the second; and
then, restart a cycle in which the second photodiode, having already received charges, acts as a first photodiode with respect to another photodiode belonging to another row of pixels.

2. The image sensor according to claim 1, wherein a pixel in a row of rank intermediate between the first row and the last row comprises, in succession, in the direction perpendicular to the direction of the rows of pixels, a first transfer gate allowing a variable-height potential barrier to be established, a first photodiode adjacent to the first gate, a second transfer gate, allowing a variable-height potential barrier to be established, and a second photodiode adjacent to the second gate and adjacent to the first gate of a pixel in the next row.

3. The image sensor according to claim 2, wherein the sequencing circuit is designed to apply, to the photodiodes and to the gates of all the rows, potentials that vary periodically in four successive phases:
a first integration phase in which the charges generated in the first photodiode of a pixel by the light are accumulated by the first photodiode whilst the charges generated by the light in the second photodiode flow from the second photodiode into the first by passing beneath the second gate and accumulating in the first photodiode;
a first transfer phase in which the charges accumulated in the first photodiode are transferred to the second photodiode;
a second integration phase in which the charges generated by the light in the second photodiode are accumulated by the second photodiode whilst charges generated by the light in the first photodiode of the pixel in the next row flow into the second photodiode by passing beneath the first gate of the pixel in the next row and accumulate in the second photodiode; and
a second transfer phase in which the charges accumulated in the second photodiode are transferred to the first photodiode of the pixel in the next row by passing beneath the first transfer gate of the pixel in the next row.

4. The image sensor according to claim 3, wherein the potentials applied to the surface region of the second photodiode during the first transfer phase and during the second integration phase, respectively, are chosen so as to create a deeper potential well beneath the second photodiode during the first transfer phase than during the second integration phase.

5. The image sensor according to, claim 4, wherein the potentials applied to the second transfer gate are chosen to lower the potential barrier beneath the second transfer gate during the first transfer phase more than during the first integration phase.

6. The image sensor according to claim 1, wherein the photodiodes of adjacent pixels in one and the same row are separated by isolating structures comprising the superposition of:
an isolating region of the first conductivity type, adjacent to the surface regions of the photodiodes, but more heavily doped than these surface regions; and
an isolating region of the second conductivity type located beneath the isolating region of the first conductivity type and completely separating the latter from the common reference region of the first conductivity type.

7. The image sensor according to claim 6, wherein the ratio of the impurity concentration in the isolating region of the first conductivity type to the impurity concentration in the isolating region of the second conductivity type is higher than the ratio of the impurity concentration in the surface region to the impurity concentration in the individual region of the second conductivity type of a photodiode, so that the potential wells created in the isolating structure are shallower than those created in the photodiode.

8. The image sensor according to claim 6, wherein an electrical contact is provided on the isolating regions of the first conductivity type so as to deliver a potential to the surface regions.

9. The image sensor according to claim 6, comprising an anti-blooming structure comprising an n-type drain in the isolating region of the first conductivity type and a control gate covering a space running from the photodiode to the drain.

10. The image sensor according to claim 6, wherein the corners of the photodiodes turned towards an adjacent photodiode are bevelled so as to limit the width of the transfer gates between two photodiodes.

11. The image sensor according to claim 7, wherein an electrical contact is provided on the isolating regions of the first conductivity type so as to deliver a potential to the surface regions.

12. The image sensor according to claim 7, wherein the corners of the photodiodes turned towards an adjacent photodiode are bevelled so as to limit the width of the transfer gates between two photodiodes.

* * * * *